United States Patent
Shimoji et al.

(10) Patent No.: US 7,354,864 B2
(45) Date of Patent: Apr. 8, 2008

(54) METHOD OF PRODUCING SEMICONDUCTOR DEVICE

(75) Inventors: Noriyuki Shimoji, Kyoto (JP); Masaki Takaoka, Kyoto (JP)

(73) Assignee: Rohm Co., Ltd., Kyoto-shi, Kyoto (JP)

( * ) Notice: Subject to any disclaimer, the term of this patent is extended or adjusted under 35 U.S.C. 154(b) by 44 days.

(21) Appl. No.: 11/276,320

(22) Filed: Feb. 24, 2006

(65) Prior Publication Data

US 2006/0141398 A1 Jun. 29, 2006

Related U.S. Application Data

(62) Division of application No. 10/426,015, filed on Apr. 30, 2003.

(30) Foreign Application Priority Data

| May 1, 2002 | (JP) | ............................. 2002-129821 |
| May 1, 2002 | (JP) | ............................. 2002-129822 |

(51) Int. Cl.
*H01L 21/302* (2006.01)
(52) U.S. Cl. ...................... 438/706; 438/723
(58) Field of Classification Search ............... 438/706, 438/710, 714, 723, 724, 725
See application file for complete search history.

(56) References Cited

U.S. PATENT DOCUMENTS

| 5,095,349 A | 3/1992 | Fujii et al. |
| 5,236,547 A | 8/1993 | Takahashi et al. |
| 5,972,757 A * | 10/1999 | Ema ............................. 438/283 |
| 5,989,974 A * | 11/1999 | Yamada et al. .............. 438/407 |
| 6,143,190 A * | 11/2000 | Yagi et al. ...................... 216/27 |
| 6,386,507 B2 | 5/2002 | Dhuler et al. |
| 6,479,921 B2 * | 11/2002 | Ma et al. ..................... 310/309 |
| 6,541,831 B2 * | 4/2003 | Lee et al. ..................... 257/415 |
| 2003/0081068 A1* | 5/2003 | Hayakawa et al. ........... 347/56 |
| 2006/0068570 A1* | 3/2006 | Hayakawa et al. ......... 438/485 |

FOREIGN PATENT DOCUMENTS

| JP | 2-1914 A | 1/1990 |
| JP | 9-135033 A | 5/1997 |
| JP | 10-337173 A | 12/1998 |
| JP | 2000-114232 | * 4/2000 |
| JP | 2000-114232 A | 4/2000 |
| JP | 2001-1515 A | 1/2001 |

* cited by examiner

*Primary Examiner*—Kin-Chan Chen
(74) *Attorney, Agent, or Firm*—Global IP Counselors, LLP

(57) ABSTRACT

A method of producing a semiconductor device is disclosed, in which a through hole is formed in the upper surface of a semiconductor substrate from the lower surface thereof, and an opening of a desired size is formed in a desired position on the upper surface of the substrate. A guide that functions as an etching stopper is formed in the semiconductor substrate. An opening having a width W2 is formed in the guide. The opening faces an opening in a mask used in the formation of a through hole, and the width W2 thereof is narrower than a width W4 of the opening in the mask. The direction in which etching progresses is controlled by the opening formed in the guide as etching is conducted from a lower surface of the substrate to an upper surface of the substrate, and thus deviations in the width W1 and position of an opening in the upper surface of the substrate can be controlled.

8 Claims, 14 Drawing Sheets

Fig.4
(A) 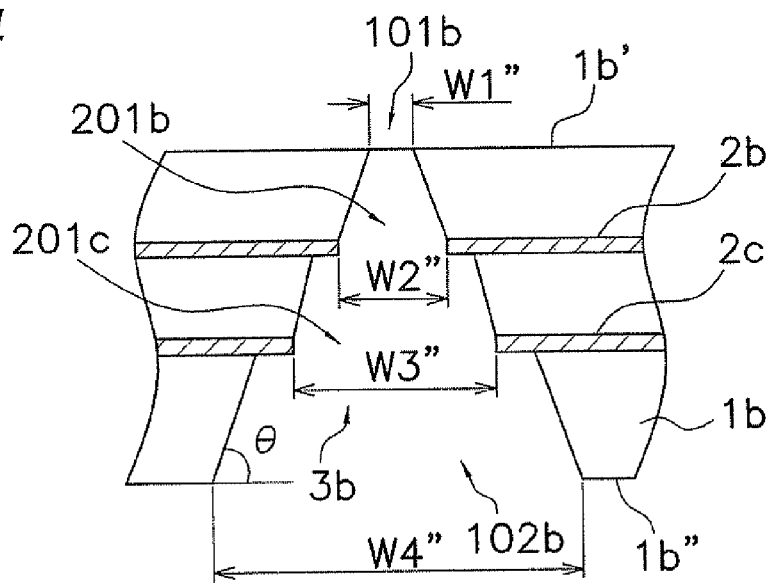
(B) 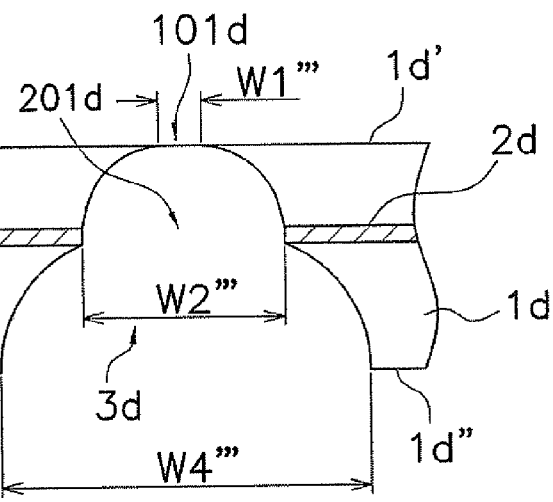
(C) 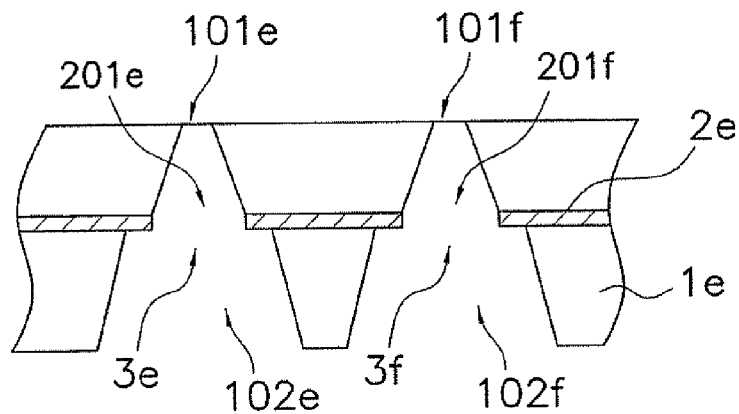

Fig.5
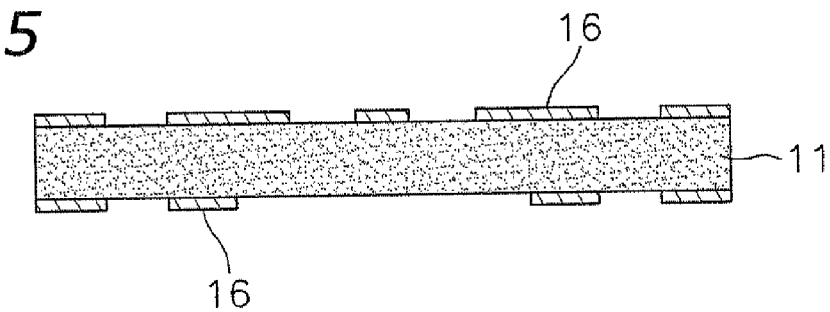
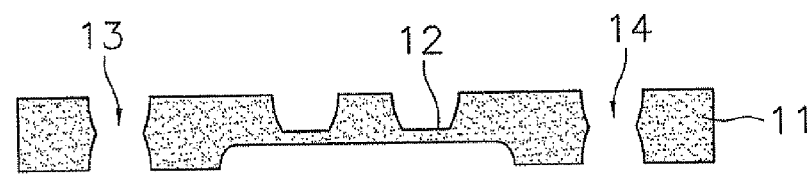
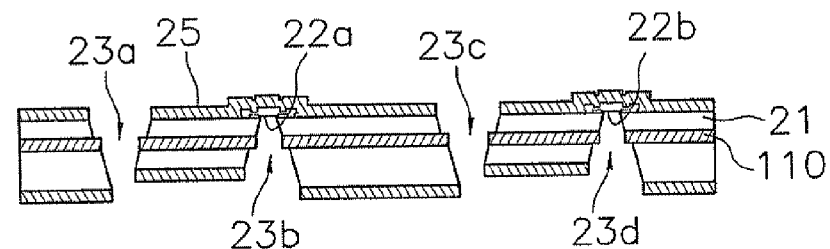
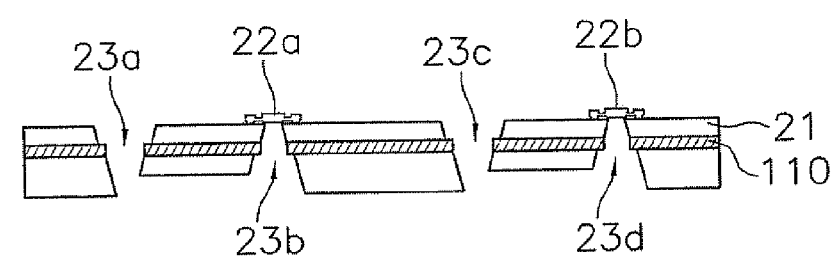
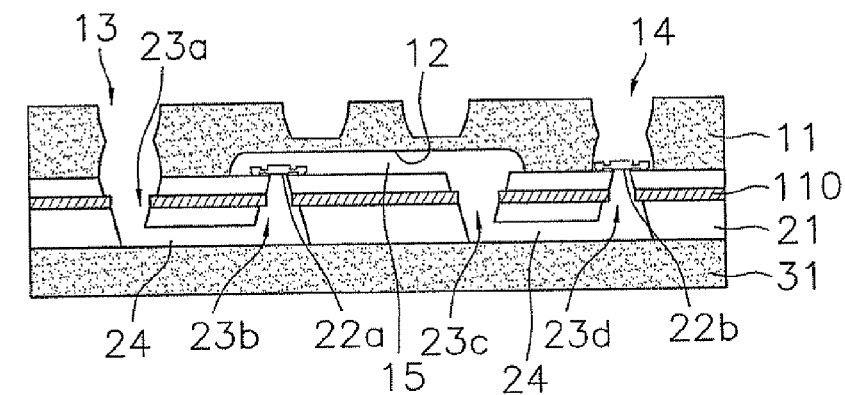

Fig.8
(G) 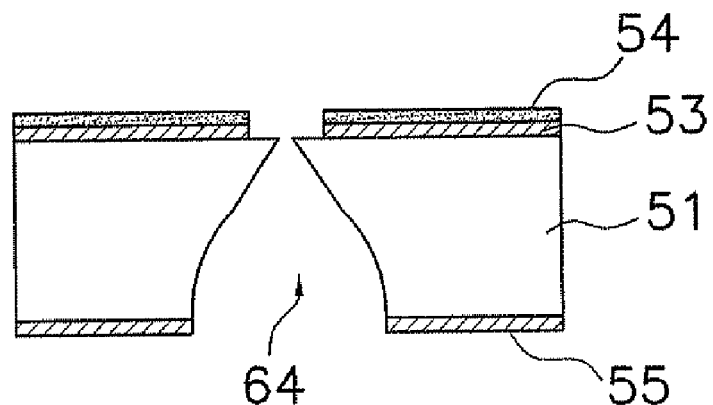
(H) 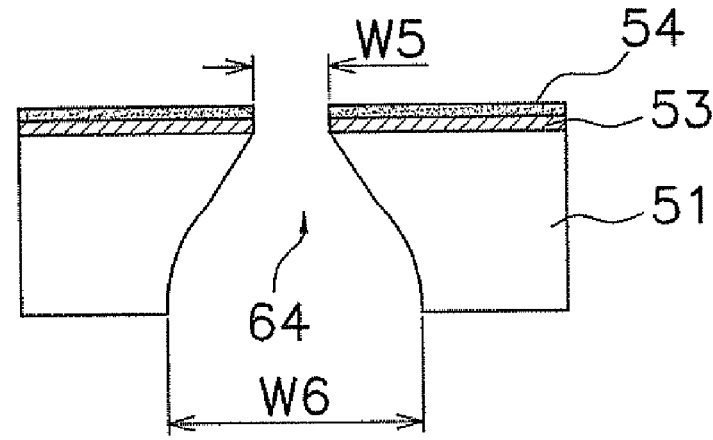

Fig.12
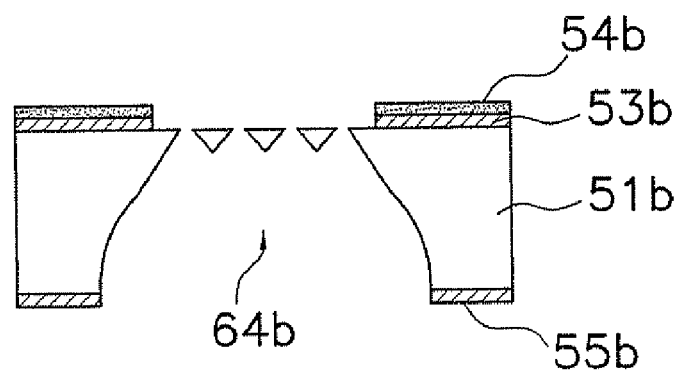
(G)
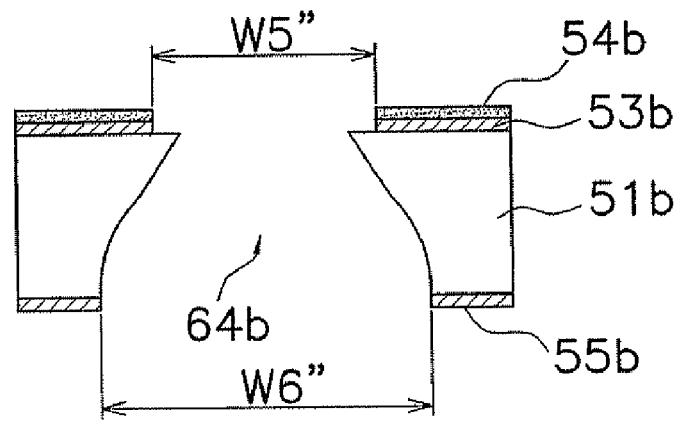
(H)
Fig.13
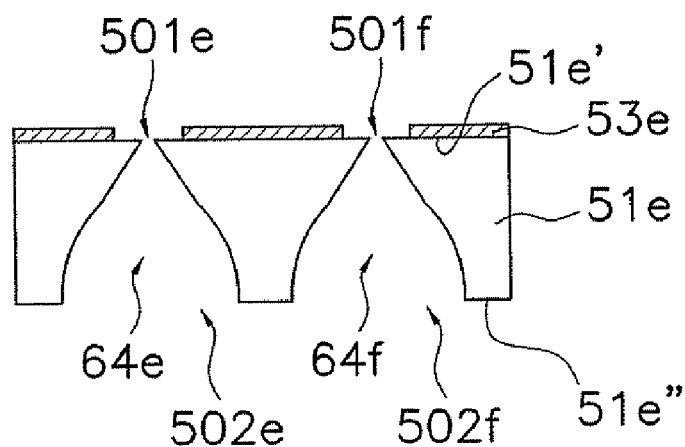

METHOD OF PRODUCING SEMICONDUCTOR DEVICE

CROSS-REFERENCE TO RELATED APPLICATIONS

This is a divisional application of U.S. patent application Ser. No. 10/426,015, filed Apr. 30, 2003, which claims priority to Japan Patent Application Nos. 2002-129821 and 2002-129822, filed on May 1, 2002, the entire disclosures of which are hereby incorporated herein by reference.

BACKGROUND OF THE INVENTION

1. Field of the Invention

The present invention relates to a method of producing a semiconductor device for use in micromachines.

2. Background Information

Micromachine technology has been proposed in the past that employs semiconductor materials such as silicon and the like. Devices that employ micromachine technology include fluid control devices such as sensors, microactuators, micropumps, and valves. With these types of devices, insulating film or metal patterns are generally used on the surface of the semiconductor substrate to form three dimensional structures.

FIG. 15 shows the structure of a micropump and the principles of its operation. FIG. 15(A) shows a discharge mode of the micropump, FIG. 15(B) shows a discharge mode of the micropump, FIG. 15(C) is a plan view of the valves, the inlet, and the outlet of the micropump, and FIG. 15(D) is an enlarged view of a valve. The micropump is comprised of a heat resistant glass plate 601 in which a diaphragm 602 is formed, a silicon substrate 701 in which valves 702a, 702b and through holes 703a, 703b, 703c, 703d (through holes 703) are formed, and a heat resistant glass plate 801 that is bonded to the surface of the silicon substrate that is opposite the side of the silicon substrate that is bonded to the heat resistant glass plate 601. A piezoactuator 603 is arranged on top of the diaphragm 602 of the heat resistant glass plate 601, and serves to oscillate the diaphragm 602. The valves 702a, 702b are formed on top of the silicon substrate 701 having the through holes 703 therein, and the through holes 703 serve as fluid pathways. The valves 702a, 702b are formed from disk-shaped valves made of polysilicon that are shaped so that they close the fluid pathways, and four arms that are fixed to the substrate on one side thereof and support the valves (see FIG. 15(C), (D)).

A micropump having this type of structure is operated by applying a voltage to the piezoactuator 603. The piezoactuator 603 to which a voltage has been applied pushes the diaphragm 602 downward. Thus, the pressure inside a pressure chamber 606 increases, the valve 702a on the inlet 604 closes, the valve 702b on the outlet 605 opens, and liquid is discharged from the outlet 605 (see FIG. 15(A)). When the voltage is switched off, the diaphragm 602 returns to its original position. Thus, the pressure inside the pressure chamber 606 decreases, the valve 702b on the outlet 605 closes, the valve 702a on the inlet 604 opens, and new liquid is drawn into the pressure chamber 606 (see FIG. 15(B)).

In a method of producing this type of micropump, after the valves 702a, 702b are formed on the silicon substrate 701, the through holes 703b, 703d are formed such that their position precisely matches the positions of the valves 702. In addition, the through holes 703a, 703c are formed so that their positions precisely match the positions of the inlet 604 and the outlet 605 formed in the heat resistant glass plate 601. The through holes 703 are formed by forming masks on both sides of the silicon substrate 701, and anisotropic etching the silicon substrate 701 from the upper and lower surfaces thereof.

However, the thickness of the silicon or other semiconductor substrate is, for example, approximately 625 micrometers if the substrate is a 6 inch wafer, and deep etching is performed on the substrate. Because of that, the direction in which etching proceeds will differ until the through hole formed thereby passes through the upper surface or the lower surface of the semiconductor substrate, and thus it is difficult to place a through hole in a desired position on a surface of the substrate. It is thought that this is due to the following reasons:

(1) Although the alignment of a position on the upper surface of a substrate that a through hole must pass through with a position on the lower surface of the substrate where etching is initiated is performed by means of image processing, it is difficult to obtain a precise alignment due to deviation in the image process.

(2) Deviation is produced in the direction in which etching proceeds due to lattice defects that exist in the semiconductor substrate, and thus the position of an opening on the upper surface thereof will deviate from the desired position.

(3) When there are large fluctuations in etching speed due to temperature and/or humidity, and when batch processing is performed, it is difficult to control irregularities in the etching speed and the amount of side etching that occurs inside the wafer and on the surface thereof.

Because of that, one has no choice but to design a semiconductor device in which the position and the size of each opening of a through hole formed in the surface of the semiconductor substrate have a margin, which will make the size of the semiconductor device larger and increase its cost of production. More specifically, even when one wants to employ a 6 inch silicon substrate and form through holes 20 micrometers in width in the surface thereof, it is estimated that a 100 micrometer space for each opening will be required during the production steps.

An object of the present invention is to form through holes having good precision in one surface of a semiconductor substrate from another surface thereof.

Another object of the present invention is to produce and provide a highly precise semiconductor device by forming through holes having openings with the required size in a surface of the semiconductor substrate from another surface thereof.

Yet another object of the present invention is to produce a semiconductor device having a consistent quality by consistently forming through holes therein regardless of the wafer or the production process employed.

SUMMARY OF THE INVENTION

According to a first aspect of the present invention, a method of producing a semiconductor device includes a guide formation step and a through hole formation step. In the guide formation step, a planar guide having a first opening is formed in an interior of a semiconductor substrate along the planar direction of the substrate with a material whose etching rate is slower than the etching rate of the semiconductor. In the through hole formation step, through holes with widths that become smaller from a first surface of the semiconductor substrate to a second surface of the semiconductor substrate are formed by etching the semiconductor substrate from the first surface.

Because deviation in the position and/or size of a through hole is corrected by the first guide during its formation, the openings formed in the surface of the semiconductor by the through hole can be placed in the desired position and have the desired size. The shape of the openings formed in the surface of the semiconductor by the through hole can be appropriately designed by means of a mask and the first opening of the first guide, and can be formed into long and narrow shapes, strip shape, circular shapes, rectangular shapes, a shape having multiple holes, or other shapes.

According to a second aspect of the present invention, the guide formation step according to the first aspect of the present invention includes the following substeps:

a substep that forms a resist on the second surface of the semiconductor substrate at a position that corresponds to the first opening to be formed in the first guide; and a substep that forms an oxide film having the first opening therein in the interior of the semiconductor substrate by implanting and annealing oxygen ions into the surface of the semiconductor substrate via the resist.

For example, if a silicon substrate is employed, a guide having an etching rate that is slower than silicon can be formed by using $SiO_2$ as an oxide film.

According to a third aspect of the present invention, the guide formation step of the first aspect includes the following substeps:

a substep that forms a resist on a surface of the semiconductor substrate at a position that corresponds to the first opening to be formed in the first guide;

a substep that forms a high density impurity diffusion layer on the surface of the semiconductor by implanting and diffusing impurities at a high density into the surface of the semiconductor substrate via the resist; and a substep in which the high density impurity diffusion layer having the first opening is formed in the interior of the semiconductor substrate by forming a semiconductor epitaxial layer on the high density impurity diffusion layer.

If this method is employed, a variety of components and functional elements can be produced on the surface of the epitaxial layer, and the quality of the semiconductor chip will be made more consistent.

According to an fourth aspect of the present invention, a method of producing a semiconductor device includes the following steps:

a guide formation step that forms a first guide on a first surface of a semiconductor substrate, the first guide being a groove shaped or hole shaped space; and a through hole formation step that etches the semiconductor substrate from a second surface of the semiconductor substrate that is opposite a first surface thereof toward the first guide, and forms a through hole that passes through the semiconductor substrate.

A through hole is formed by etching from a lower surface of the substrate after a narrow hole, e.g., a groove having a width of 1 micrometer, is formed in an upper surface (first surface) of the semiconductor substrate, and additional lattice defects are preferably introduced into the periphery of the narrow groove. In this step, the etching is guided by the portions in which lattice defects are produced in the periphery of the groove. Because of that, the narrow groove is used as a guide, the etching quickly proceeds, and a through hole having an opening with a width that is approximately equal with that of the groove is formed in the surface of the substrate. A semiconductor device formed in this manner can have functional elements such as integrated circuits mounted on the surface of the substrate with a high degree of precision, because through holes having the desired widths can be formed at the desired positions on the surface of the substrate. The width of a through hole can be adjusted to a desired width by conducting additional etching as needed. Thus, semiconductor chips having a high degree of precision and good yield can be produced without the need to have a margin for deviation in the position and size of a through hole when forming the through hole.

According to a fifth aspect of the present invention, the method of producing a semiconductor device according to the fourth aspect further includes a surface film formation step. The surface film formation step forms a surface film on the first surface that covers at least the first guide, the surface film being formed from a material whose etching rate is faster than that of the semiconductor substrate.

In this method, a surface film that covers a narrow groove is formed. Integrated circuits may be formed on top of the surface film. The surface film that is in the opening or the interior of a through hole can be removed either by etching during the through hole formation step or by etching that is independent of the etching performed during the through hole formation step.

According to a sixth aspect of the present invention, the method of producing a semiconductor substrate according to the fourth aspect further includes a lattice defect introduction step that introduces lattice defects in the periphery of the first guide of the semiconductor substrate.

In this method, etching proceeds along the first guide due to the lattice defects that were introduced in the periphery of the first guide. Because of that, a through hole having an opening width that is the same as the width of the first guide, e.g., 1 micrometer, can be formed by etching from the second surface toward a desired position on the first surface.

According to a seventh aspect of the present invention, the semiconductor substrate used in the fifth or sixth aspects of the present invention is a silicon substrate, and the surface film is formed in the surface film formation step by means of a silicon oxide film or polysilicon.

In particular, this method has the benefit of making it particularly easy to control the position of the opening of a through hole in the first surface because it is possible to etch polysilicon faster than silicon.

According to an eighth aspect of the present invention, the surface film of the fifth or sixth aspects of the present invention is formed in the surface formation step by means of CVD (Chemical Vapor Deposition).

If the surface film is formed by CVD, e.g., plasma CVD, it will be difficult for the surface film to enter into the interior of a narrow groove that is formed in a portion of the substrate that is to become a through hole. Because of that, only the opening portion of the first guide is covered with the surface film, the interior of the first guide will be hollow, and it will be easier to remove the unneeded portions of the surface film than it would be if the entire groove was covered with the surface film.

According to a ninth aspect of the present invention, the method of producing a semiconductor device according to any of the fourth to eighth aspects of the present invention further includes an adjustment step that adjusts the width of a through hole.

The width of a through hole can be adjusted according to need in the adjustment step.

According to a tenth aspect of the present invention, the through hole formation step according to the fourth aspect of the present invention includes the following steps:

a primary etching step that forms a through hole up to a tip of the first guide by means of anisotropic etching or isotropic etching; and a secondary etching step that passes the through hole through to the first surface by means of anisotropic etching.

The primary etching is conducted first, and this etching is conducted up to the tip of the first guide. Thus, during through hole formation, the through hole will accurately and quickly arrive at the tip of the guide. After that, the method switches to anisotropic etching, and the through hole is passed through to the surface of the substrate. The rim of an opening of a through hole in the surface of the substrate can be formed to be thicker than the rim would be with isotropic etching by conducting anisotropic etching in the secondary etching.

According to an eleventh aspect of the present invention, a second guide is further formed in the guide formation step according to the fourth aspect of the present invention, the second guide being a groove shaped or hole shaped space. In the through hole formation step, a through hole that passes through the semiconductor substrate is formed by etching the semiconductor substrate from a second surface of the semiconductor substrate that is opposite the first surface thereof toward the first guide and the second guide.

When one wants to form a large through hole having good precision, this method will form a plurality of guides, and will form a though hole that corresponds to each guide. Thus, large through hole having the desired size can be formed at the desired positions.

BRIEF DESCRIPTION OF THE DRAWINGS

FIG. 4(A) shows the basic structure of a semiconductor device according to a third embodiment of the present invention;

FIG. 4(B) shows the basic structure of a semiconductor device according to a fourth embodiment of the present invention;

FIG. 4(C) shows the basic structure of a semiconductor device according to a fifth embodiment of the present invention;

FIGS. 5(A) to 5(F) shows cross sectional views of a micropump in which the basic structure of the semiconductor device according to the first embodiment of the present invention has been adopted;

FIGS. 8(G) to (H) shows additional steps in the manufacturing process of the semiconductor device shown in FIG. 6;

FIGS. 11(A) to 11(F) show steps in the process of manufacturing a semiconductor device according to a eighth embodiment of the present invention the;

FIG. 12(G) and 12(H) show additional steps in the manufacturing process of the semiconductor device shown in FIG. 11;

FIG. 13 shows the structure of a semiconductor device according to a ninth embodiment of the present invention;

DETAILED DESCRIPTION OF THE PREFERRED EMBODIMENTS

1. First Embodiment

Figure 1:
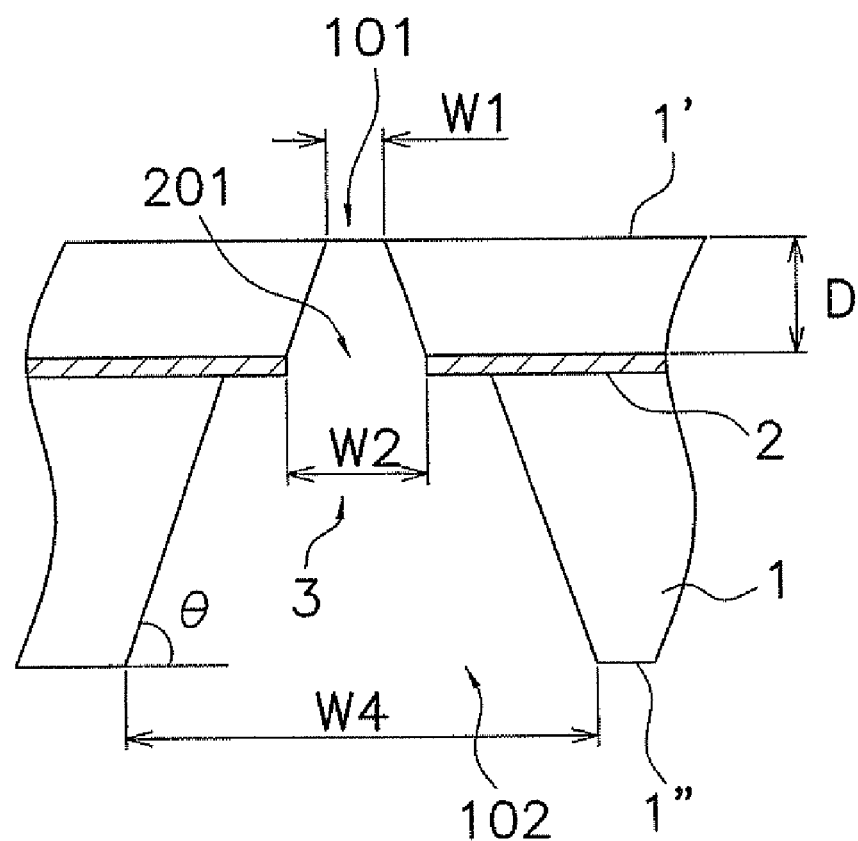
FIG. 1 shows a cross-section of a semiconductor device according to a first embodiment of the present invention.

FIG. 1 shows the basic structure of a semiconductor device according to a first embodiment of the present invention. This semiconductor device has a semiconductor substrate 1 such as Si, GaAs, and InP and a planar shaped guide 2. A through hole 3 that passes through the semiconductor substrate 1 is formed in the semiconductor device.

Depending on the type of device, a variety of functional elements may be formed on an upper surface 1a of the semiconductor substrate 1. Openings 101 and 102 are respectively formed in an upper surface 1' and lower surface 1" of the semiconductor substrate by means of the through hole 3. The planar shape of the openings 101, 102 is not particularly limited to a long and narrow shape, a round shape, a rectangular shape, or the like, and will differ according to the functional elements formed on the upper surface 1' of the semiconductor substrate or the function of the through hole 3.

The planar shaped guide 2 is formed in the interior of the semiconductor substrate 1 along the planar direction of the substrate. The guide 2 is formed from an impurity diffusion layer of, for example, boron (B), phosphorous (P), arsenic (As), or antimony (Sb), or from an $SiO_2$ layer that is obtained by heat treating the Si substrate 1 after it has been implanted with oxygen ions. In fact, the material of the guide 2 is not particularly limited so long as the etching selectivity ratio of the material is higher than the etching selectivity ratio of the semiconductor substrate 1, and a material suitable for use in the formation of the through hole 3 may be used. The thickness of the guide 2 will differ according to the etchant employed in the formation of the through hole 3, but will be thick enough so that it can function as an etching stopper.

An opening 201 having a width W2 is formed in the guide 2. The opening 201 is provided in a position opposite the openings 101, 102 in both surfaces of the semiconductor substrate 1. The planar shape of the opening 201 is formed in accordance with the opening 101 formed in the upper surface 1' of the semiconductor substrate, and the opening 201 has, for example, a long and narrow shape, a circular shape, or a rectangular shape. The width W2 of the opening 201 is narrower than a width W4 of the opening 102 in the lower surface 1" of the substrate (W4>W2) due to the through hole 3, and is wider than a width W1 of the opening 101 in the upper surface 1' of the substrate (W2>W1). In addition, the opening width W2 depends upon an angle θ formed by the inner wall of the semiconductor substrate 1 that forms the through hole 3 and a line extending from the lower surface 1", and a depth D from the upper surface 1' of the guide 2. For example, the width W2 will narrow as the depth D decreases. In addition, the width W2 will increase as the angle θ becomes smaller.

The width of the through hole 3 narrows from the lower surface 1" to the upper surface 1' of the substrate as it passes through the semiconductor substrate 1. The inner wall of the semiconductor substrate 1 that forms the through hole 3 can, for example, be a <111> silicon orientation. However, the orientation of the surface that is produced, i.e., the angle θ formed by the inner wall of the through hole 3 and the line extending from the rear surface 1", depends upon the etchant employed in the formation of the through hole 3. Note that in situations in which the Si substrate has a <100> orientation and a surface having a specific orientation is produced in the through hole 3, the planar shape of the through hole 3, e.g., the openings 101, 103, and 201, will be long and narrow or rectangular.

A method of producing the semiconductor device shown in FIG. 1 will now be described with reference to FIG. 2. Here, the method of production described employs a silicon substrate as an example.

First, a resist film 5 is formed on the upper surface of the silicon substrate 1, and the SIMOX (Separation by Implanted Oxygen) method is employed to implant oxygen ions (FIG. 1(A)). The resist film 5 is shaped to correspond to the opening 201 that will be formed in the guide 2. The depth D to which the oxygen ions are implanted is determined by taking the thickness of the components to be formed on the upper surface of the silicon substrate 1 into consideration. Normally, a depth D of between several micrometers to 10 micrometers will be sufficient for component formation. A guide 2 comprised of $SiO_2$ and having an opening 201 with the same shape as that of the resist film 5 is then formed by annealing the silicon substrate 1 at a high temperature and removing the resist film 5 (FIG. 1(B)). The thickness of the guide 2 will differ depending upon the etchant employed in the formation of the through hole 3, but the guide 2 will have a thickness that will function as an etchant stopper during the process that forms the through hole 3 by means of etching. The guide 2 may be thin if the etching rate is slow, and conversely, may be thick if the etching rate is fast. In situations in which TMAH is employed as an etchant for a 6 inch silicon substrate, it is appropriate for the guide 2 to have an average thickness of 0.5 micrometers. Likewise, a patterned $SiO_2$ film is formed onto the lower surface 1" of the silicon substrate 1. The patterned $SiO_2$ film has an opening that corresponds to the opening 102 of the through hole 3 to be formed in the lower surface 1" of the substrate.

After that, the $SiO_2$ layer is used as a mask 4, and the lower surface of the silicon substrate 1 is subjected to alkaline or acidic etching (FIG. 2(C)). If alkaline etching is employed, then, for example, a 22% TMAH (tetramethylammonium hydroxide) solution is employed and etching is conducted at 80° C. The etchant may be an alkaline etchant such as KOH or the like or an acidic etchant, and is not particularly limited so long as it does not damage the electrical characteristics of the semiconductor. In situations in which one wants the inner surface of the through hole 3 to have a specific orientation, TMAH or the like is employed and anisotropic etching is conducted to produce an inner wall of the through hole 3 which has a <111> silicon orientation. Generally, it is preferable to produce a <111> oriented surface that is closely packed and stable. Note that when the density of the etchant is too low, there will be a tendency for the inner wall of the through hole 3 to be covered with etch pits, etching will fail to proceed, and it will become difficult to form the through hole 3.

After the through hole 3 that opens to the lower surface 1" of the substrate is formed by etching, a semiconductor device is obtained by removing the mask 4 (FIG. 2(D)). In the process in which the through hole 3 is formed by etching from the lower surface 1" to the upper surface 1' of the substrate, the direction in which the etching progresses is limited by the guide 2, and thus deviation in the width W1 and the position of the opening 101 formed in the upper surface 1' can be controlled better than in situations in which there is no guide 2.

In a semiconductor device obtained in this manner, the width W1 of the opening of the through hole 3 in the upper surface 1' will be small, and will be formed in the desired position. More specifically, if a 6 inch silicon substrate is employed, a long and narrow through hole 3 having an opening width of approximately 20 micrometers or less can be formed in the upper surface of the silicon substrate. Because of that, the margin for deviation in the size and/or position of the opening 101 can be reduced, and thus a reduction in the size of and an increase in the precision of semiconductor chips that employ the present device can be facilitated. In addition, in both the wafer and the etching process, deviation in the size and/or position of the opening 101 of the upper surface 1' can be prevented, yields increased, and the cost of semiconductor chips which employ the present device can be reduced.

As noted above, a guide that functions as an etching stopper is formed inside the semiconductor substrate, and thus a through hole having a desired position and desired size in one surface of the semiconductor substrate can be formed from the other surface thereof. In addition, because the position and size of the opening of the through hole can be controlled, a highly precise semiconductor device can be produced with consistently good yields.

2. Second Embodiment

Figure 2:
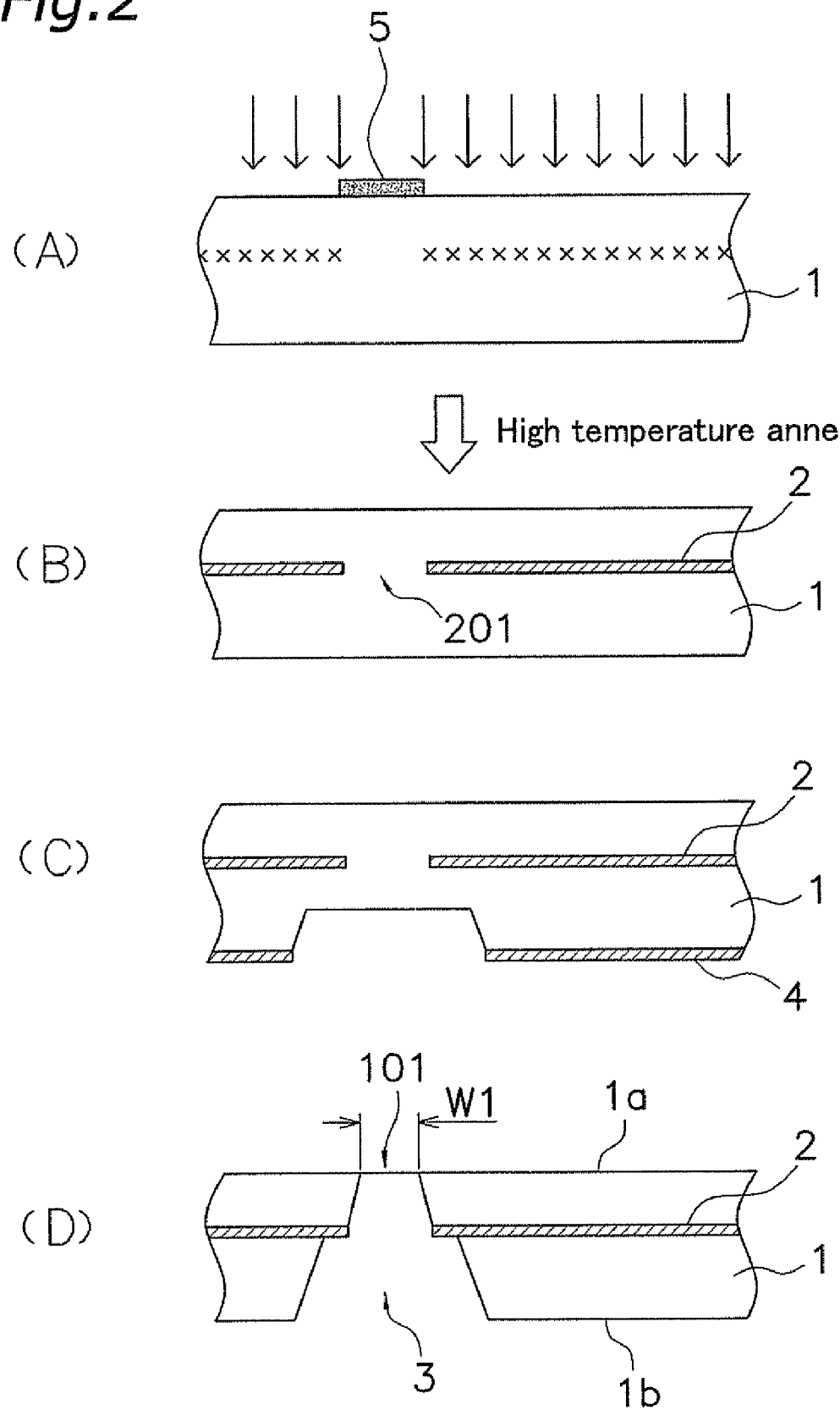
FIGS. 2(A) to 2(D) shows steps in a manufacturing process for the semiconductor device shown in FIG. 1.
Figure 3:
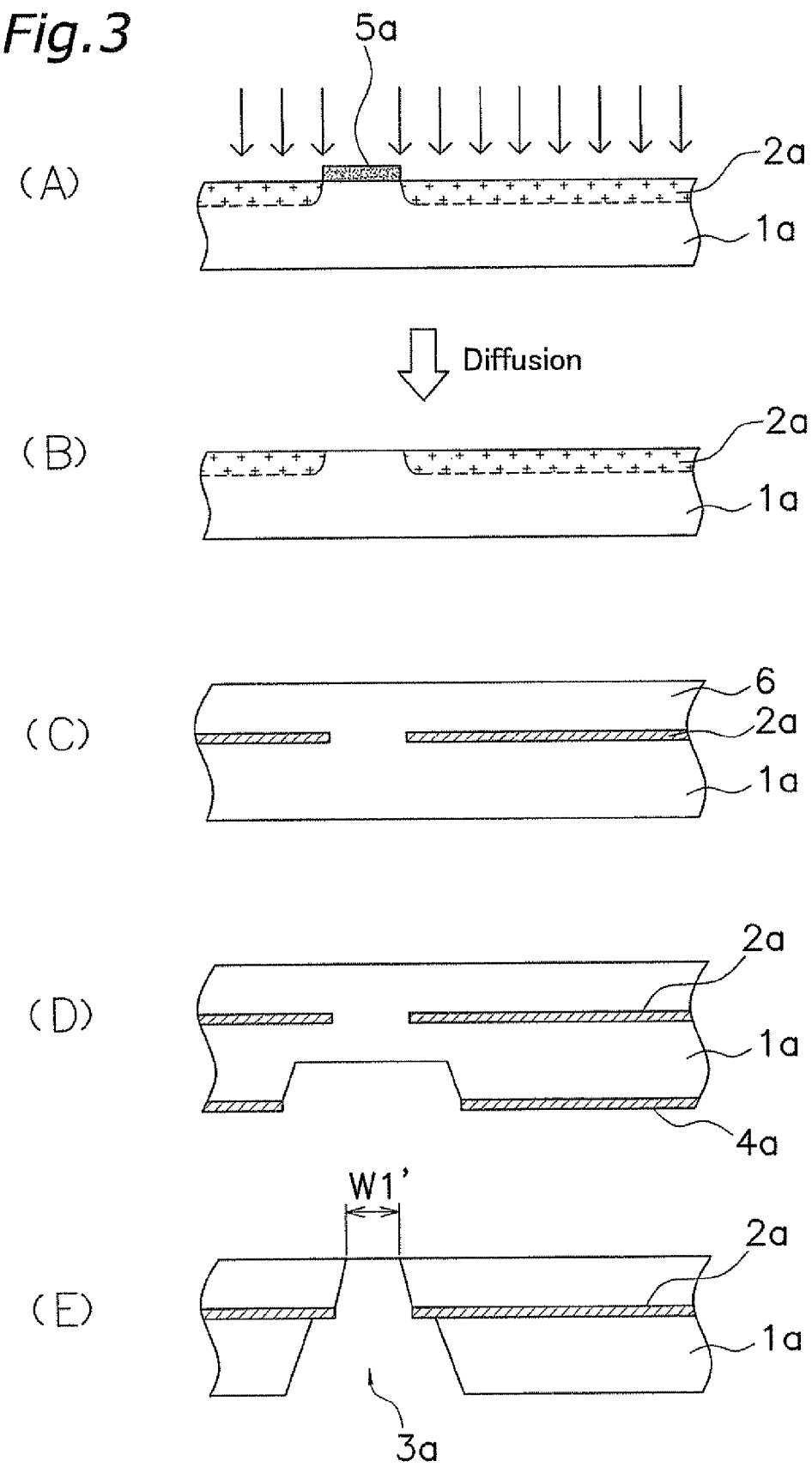
FIGS. 3(A) to 3(E) shows steps in another manufacturing process for the semiconductor device shown in FIG. 1.

FIG. 3 shows a semiconductor device according to a second embodiment and a method of producing the same. The guide formation method in the method of production according to the present embodiment is different than the method of production shown in FIG. 2. Like in FIG. 2, a semiconductor device that employs a silicon substrate is used as an example.

First, a resist film 5a is formed on the upper surface of the silicon substrate 1a, and boron, arsenic, phosphorous, or other similar ions are implanted into the upper surface of the silicon substrate at a high density via the resist film 5a (FIG. 3(A)). The implanted ions are then diffused, and a high density diffusion layer 2a that will become a guide is formed in the silicon substrate 1a (FIG. 3(B)). The resist film 5a is removed, silicon is epitaxially grown on the high density diffusion layer 2a, and an Si epitaxial layer 6 is formed (FIG. 3(C)). In addition, a diffusion layer 4a having an opening is formed on the lower surface of the silicon substrate 1a by ion implantation and diffusion. After that, the silicon substrate 1a is etched from the lower surface thereof via a mask 4a that comprises a diffusion layer (FIG. 3(D)), and a semiconductor device having a through hole 3a therethrough is obtained (FIG. 3(E)).

In this method, when a boron diffusion layer for the guide 2a and an alkaline etchant are employed, there will be a need to properly control the density of the boron in the layer. When TMAH is employed, the etching selectivity ratio between silicon and a boron diffusion layer having a boron density of $10^{19}/cm^3$ or greater is 100:1, and this is clearly low compared to the selectivity ratio between silicon and $SiO_2$ of approximately 1000:1 noted above. Thus, it is preferable that boron be implanted such that the density of the boron in the guide 2a (the high density diffusion layer) be at least $10^{19}/cm^3$ or greater.

In addition, the thickness of the Si epitaxial layer 6 that is formed on the guide 2a is set so that the guide 2a will function as a stopper during the time it takes for the through hole 3 to reach the upper surface of the silicon substrate 1 from the guide 2a. However, as noted above, the epitaxial layer 6 must have a thickness of several micrometers to 10 micrometers in order to form components thereon.

The advantages of this method is that it allows components to be produced on the epitaxial layer 6, and costs less than the production method shown in FIG. 2. However, due to the materials employed in the guide 2a, attention must be paid to the density of the impurities in the guide 2a because it cannot be said that the etching rate will be sufficiently slow.

3. Third Embodiment

FIG. 4(A) shows the basic structure of a semiconductor device according to a third embodiment. As shown in this figure, a plurality of guides 2b, 2c, etc. may be provided at different depths inside the semiconductor substrate 1b. FIG. 4(A) shows a semiconductor device in which planar guides 2b, 2c respectively having openings 201b, 201c therein are provided along the direction of the substrate surface. Here, the opening 201b is opposite the opening 201c and the opening 101 in the upper surface 1b' of the substrate. In addition, the opening 201c is opposite the opening 201b and the opening 102b in the lower surface 1b" of the substrate. Widths W2", W3" of the openings 201b, 201c in the guides, and widths W1", W4" of the openings 101b, 102b in both surfaces of the substrate, are formed so that they become narrow from the lower surface 1b" of the semiconductor substrate toward the upper surface 1b' (W4">W3">W2">W1"). In the process of forming the through hole 3b by etching, the through hole 3b, i.e., the width and/or position of the opening 101b, can be controlled to be even more precise by guiding the direction in which etching progresses across multiple steps. In addition, it can be expected that the width W1" of the opening 101b in the upper surface of the substrate can be formed to be even smaller, and the position thereof can be controlled to be even more precise. This embodiment is preferred in situations in which the semiconductor 1 is thick, and in situations in which one wants to form an extremely small opening in the surface of a semiconductor substrate.

4. Fourth Embodiment

FIG. 4(B) shows the basic structure of a semiconductor device according to a fourth embodiment. The method of forming a through hole is not limited to the anisotropic etching shown in FIGS. 2 and 3. In situations in which anisotropic etching is not conducted, s semiconductor device having a multi-arch shaped through hole 3d schematically illustrated in FIG. 4(B) will be produced because a surface having a specific orientation will not produced. Even in this situation, the width of the opening of the through hole 3d is formed so that it narrows from the lower surface 1d''' of the semiconductor substrate 1d to the upper surface 1d' thereof. In addition, the opening width W4''' of the lower surface 1d''' of the substrate, the opening width W2''' of the guide 2d, and the opening width W1''' of the upper surface 1d' of the substrate have the relationship W4'''>W2'''>W1'''. A circular through hole 3d having a planar shape can be formed by forming a mask pattern for forming the through hole 3d and the opening 201d in the guide 2d in a circular shape, and then conducting isotropic etching. In other words, a circular opening 101d can be formed in the upper surface 1d' of the semiconductor device.

5. Fifth Embodiment

FIG. 4(C) shows the basic structure of a semiconductor device according to a fifth embodiment. In the semiconductor device shown in this figure, a plurality of through holes 3e, 3f are formed. A plurality of openings 101e, 101f are formed in the upper surface 1e' of the substrate, and a plurality of openings 102e, 102f are formed in the lower surface 1e" of the substrate. The plurality of openings 101e, 101f are formed in the upper surface 1e' of the substrate by forming a plurality of openings 201e, 201f in the guide 2e, forming a mask for etching the openings 102e, 102f in the lower surface of the substrate, and then performing etching.

EXAMPLE 1

Micropump

FIG. 5 shows an example of a semiconductor device in which the basic structure disclosed in the first embodiment is applied in a micropump.

FIGS. 5(A)-(F) show the steps of producing the essential portions of a micropump, and FIG. 5(F) shows the structure of the essential portions of the micropump. As shown in FIG. 5(F), the micropump includes a silicon substrate 21 on which pumps 22a, 22b are formed, and heat-resistant glass plates 11, 31 that are bonded to both surfaces of the silicon substrate 21.

A diaphragm 12, a liquid inlet 13, and a liquid outlet 14 are formed in the heat-resistant glass plate 11. The diaphragm 12 forms a pressure chamber 15 between it and the surface of the silicon substrate 21. A piezoactuator (not shown in the figures) that serves to oscillate the diaphragm 12 is attached on top of the diaphragm 12, and changes the pressure inside the pressure chamber 15.

Through holes 23a, 23b, 23c, 23d (through holes 23) are formed in the silicon substrate 21. Valves 22a and 22b (valves 22) are respectively provided in the through holes 23b and 23d. In addition, the through holes 23a and 23d are formed so that they respectively open to the positions of the inlet 13 and the outlet 14 formed in the heat-resistant plate 11, and liquid that is drawn in from the inlet 14 flows sequentially through the through holes 23a, 23b, 23c and 23d, and is then discharged from the outlet 15. The other two through holes 23b and 23c have openings that are inside the pressure chamber 15 in between the diaphragm 12 and the upper surface of the silicon substrate 21. A liquid channel 24 is formed between the lower surface of the silicon substrate 21 and the heat resistant glass plate 31, which allows the through hole 23a to communicate with the through hole 23b, and also allows the through hole 23c to communicate with the through hole 23d.

Next, a method of producing the micropump shown in FIG. 5(F) will now be described with reference to FIGS. 5(A)-(F).

FIGS. 5(A) and (B) show the process of forming the diaphragm 12, the inlet 13, and the outlet 14 in the heat-resistant glass plate 11. First, an etching mask, e.g., Cr—Cu, is vacuum deposited on both surfaces of the heat-resistant glass plate 11, and a resist 16 is formed by photoetching both surfaces (see FIG. 5(A)). The etching mask and the resist 16 correspond to the diaphragm 12, the inlet 13, the outlet 14, and the pressure chamber 15. Next, a liquid (e.g. 50% HF)

is used to form a portion of the pressure chamber 15 in the lower surface of the heat-resistant glass plate 11, and then the portion of the pressure chamber 15 formed therein is covered with wax or the like and the diaphragm 12 is formed by etching the upper surface thereof. The diaphragm 12 is then covered with more wax, and further etching is performed to form through holes that correspond to the inlet 13 and the outlet 14. After this, the resist and the etching mask are removed (see FIG. 5(B)).

FIGS. 5(C)-(E) show the process that forms the valves 22 and the through holes 23 in the silicon substrate 21. First, a guide 110 comprised of an impurity diffusion layer is formed in, for example, a <100> silicon substrate 21 by means of the method noted above (see FIG. 5(C)). Because strongly alkaline compounds are also present in the liquid, it is preferable that when using boron as a dopant that the density thereof in the guide 110 be $8 \times 10^{19}$ cm$^3$ or higher. In addition, an etching mask (e.g. SiO$_2$) that corresponds to the liquid channel 24 is formed on the lower surface of the silicon substrate 21, and the liquid channel 24 is formed therein by means of anisotropic etching (see FIG. 5(C)).

Next, the valves 22a, 22b are formed on the upper surface of the silicon substrate 21 by CVD and plasma etching a photoresist that is used as a mask. The through holes 23a, 23b, 23c, and 23d that pass through the silicon substrate 21 are formed therein by protecting both surfaces of the silicon substrate 21 with, for example, Si$_3$N$_4$ or SiO$_2$, and then anisotropic etching the silicon substrate 21 from the lower surface and the upper surface thereof (see FIG. 5(D)). The through holes 23a, 23c are formed from the upper surface of the silicon so that the widths thereof narrow from the upper surface of the substrate toward the lower surface thereof. In addition, the other two through holes 23b, 23d are formed from the lower surface of the silicon so that the widths thereof narrow from the lower surface of the substrate toward the upper surface thereof. If a 6 inch silicon substrate is used, the width of the openings of the through holes 23 in the surfaces of the substrate can be approximately 20 micrometers or less.

After this, the etching mask made of Si$_3$N$_4$ or the like is removed (see FIG. 5(E)), the heat-resistant glass plates 11, 31 are bonded with the silicon substrate by means of anode bonding, and the micropump shown in FIG. 5(F) is obtained thereby. The bonding occurs by, for example, heating to a temperature of approximately 400° C., and applying a negative voltage of approximately 500V to the heat-resistant glass plates.

In this type of micropump, a guide 11 having openings therein controls the direction at which etching proceeds during the steps that form the through holes 23, and thus deviation in the widths and positions of the openings of the through holes 23 in the surfaces of the substrate can be controlled. Thus, a variety of elements and/or functional parts such as the valves 22, the pressure chamber 15, the liquid channel 24, the inlet 13, and the outlet 14 can be formed on the silicon substrate with a high degree of precision.

A micropump was used here as an example, but it is possible to apply the present invention to a variety of other micromachines such as microvalves or flow sensors.

6. Sixth Embodiment

Figure 6:
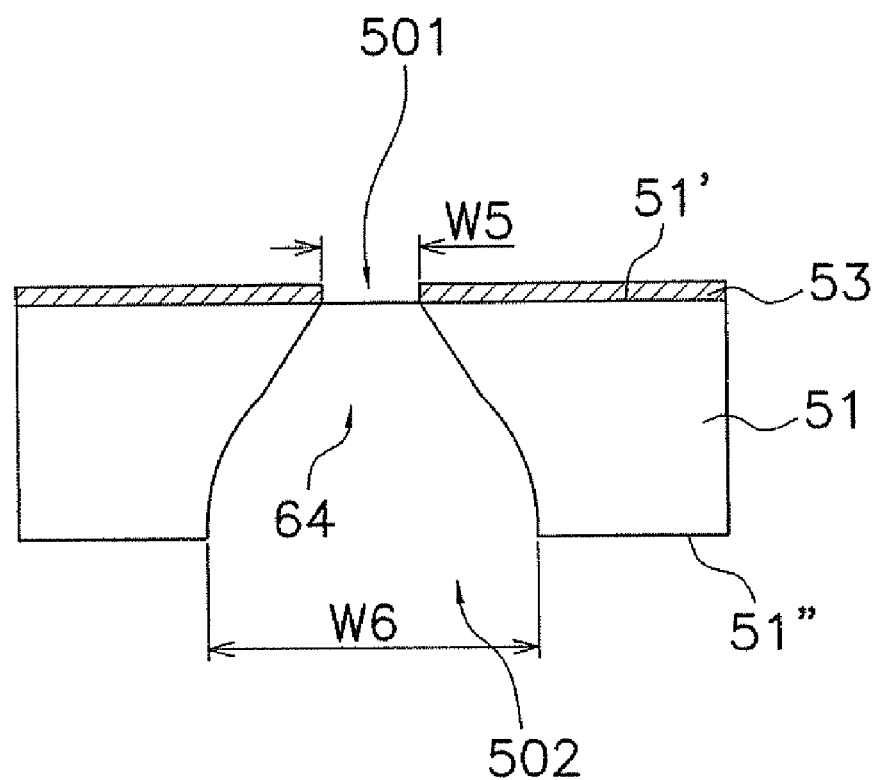
FIG. 6 shows a cross-section of a semiconductor device according to a sixth embodiment of the present invention.

FIG. 6 shows the basic structure of a semiconductor device according to a sixth embodiment of the present invention. This semiconductor device includes a semiconductor substrate 51 such as Si, GaAs, or InP in which a through hole 64 is formed, and a surface film 53 that is formed on at least one portion of the upper surface 51' of the substrate.

Depending on the type of device, a variety of functional portions may be formed on the upper surface 51' of the semiconductor substrate 51 (see FIG. 8(H) noted below). Here, the upper surface 51' of the substrate is the surface on which functional elements such as electrodes and various elements are formed. Openings 501 and 502 are respectively formed in the upper surface 51' and a lower surface 51" of the semiconductor substrate 51 by means of the through hole 64. The planar shape of the openings 501, 502 will depend on the function of the functional portions that are formed on top of the upper surface 51' of the semiconductor substrate 51 and/or the through hole 64, but will have a long and narrow shape, a rectangular shape, or the like.

The width of the through hole 64 narrows from the lower surface 51" of the substrate to the upper surface 51' and passes through the semiconductor substrate 51. The width W6 of the opening 502 on the lower surface 51" of the substrate is wider than the width W5 of the opening 501 on the upper surface of the substrate 51' (W6>W5) due to the through hole 64. As noted below, the through hole 64 is formed by etching from the lower surface 51" of the substrate, and the area around the opening 501 in the upper surface 51' of the substrate is formed by etching in accordance with the guide. The guide will be described below.

Figure 7:
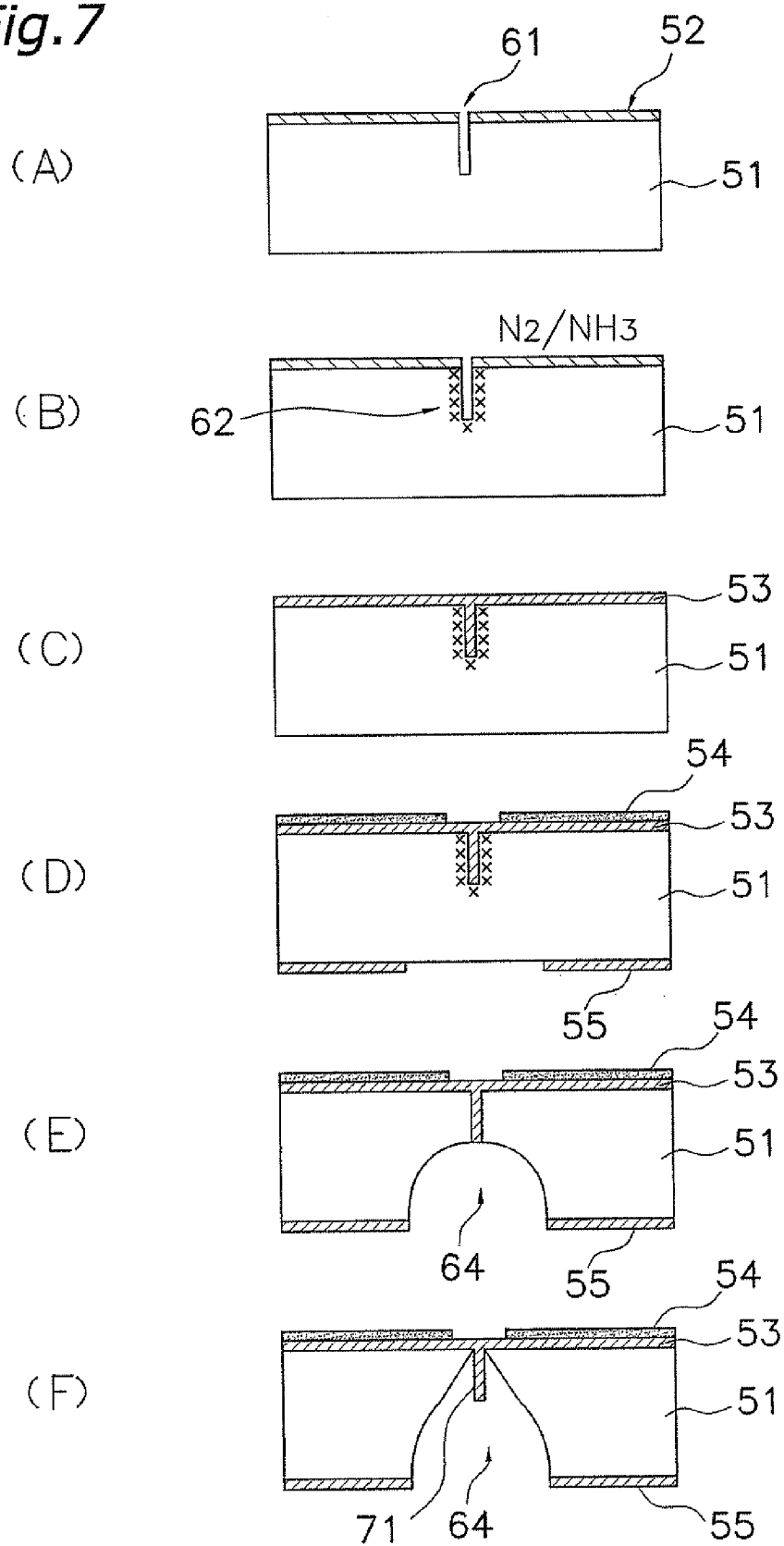
FIGS. 7(A) to 7(F) show steps in the manufacturing process of the semiconductor device shown in FIG. 6.

Next, a method of producing the semiconductor device shown in FIG. 6 will be described with reference to FIGS. 7 and 8. Here, the method of production described employs a silicon substrate as an example.

First, a mask 52 made of SiN, SiO$_2$, or the like is formed on the upper surface of the silicon substrate 51, high density plasma etching or the like is employed to conduct Si etching from the upper surface of the substrate via the mask 52, and a groove-shaped or rectangular-shaped guide 61 having a width of 1 micrometer is formed in the silicon substrate 51 (FIG. 7(A)). It is preferred that the width of the guide 61 not exceed 1 micrometer so that the opening in the guide 61 can be easily covered by means of a surface film 53 described below. The etching conditions are, for example, SF6 used as the etching gas, and anisotropic dry etching performed. The guide 61 is formed to a depth that will not have an effect on the surface devices, e.g., a depth of 50 micrometers.

Next, lattice defects 62 are introduced into the surface of the silicon substrate that is exposed inside the guide 61 (FIG. 7(B)). This, for example, is carried out by means of a nitriding process in which the exposed silicon substrate surface is exposed to N$_2$ gas or NH$_3$ gas at a high temperature, e.g., 1000° C. for 10 minutes. As noted below, the lattice defects 62 serve to guide the progress of the etching around the periphery of the guide 61 when etching is performed from the lower surface 51" of the substrate.

After this, the mask 52 is removed in accordance with need, a planar surface film 53 is formed on the silicon substrate 51 by means of CVD or thermal oxidation, and the guide 61 is covered thereby (FIG. 7(C)). The material of the surface film 53 is chosen from materials that can be etched at an etching rate that is faster than that of the semiconductor substrate 51, depending on the etchant selected. In addition, the material of the surface film 53 is preferably a material in which a variety of elements can be formed on top thereof with normal semiconductor processes. For example, a polysilicon CVD film or a silicon thermal oxidation film that can be selectively etched with respect to the silicon substrate by hydrofluoric acid and on which integrated circuits can be formed is used to form the surface film 53. Polysilicon is more preferred because when removing the surface layer 53 in the process noted below, polysilicon can be selectively etched faster than silicon. A functional portion 54 such as an integrated circuit and the like is formed on top of the surface film 53, and a mask 55 made of SiN, $SiO_2$, or the like is formed on the lower surface 51" of the substrate (FIG. 7(D)). If the semiconductor device is employed as a micropump, examples of the functional portion 54 include a valve, an arm, a fixed ring, and the like.

Furthermore, primary etching is performed from the lower surface 51" of the substrate via the mask 55 by means of alkaline wet etching or acidic wet etching, and a through hole 64 is formed up to the tip of the guide 61 (FIG. 7(E)). The etching conditions are adjusted so that the through hole 64 reaches the tip of the guide 61. For example, if a 6 inch silicon substrate is employed, then, for example, a 22% TMAH (tetramethylammonium hydroxide) solution is employed and etching is conducted at 80° C. for 15 hours.

The primary etching continues, secondary etching is performed, and the through hole 64 reaches the upper surface 51' of the substrate (FIG. 7(F)). In this process, the through hole 64 is formed along the guide 61 and finally reaches the opening of the guide 61 because the etching progresses along the lattice defects formed around the periphery of the guide 61. The secondary etching is preferably performed by anisotropic wet etching in order to maintain the thickness in the edges of the opening of the through hole 64 in the upper surface 51'. For example, when using <111> silicon, TMAH (tetramethylammonium hydroxide) and the like is used to perform anisotropic etching. The etching conditions are adjusted so that the through hole 64 reaches the upper surface 51' of the substrate.

After that, the portion of the surface film 53 that remains in the through hole 64 is selectively etched from the lower surface 51" of the substrate and removed (FIG. 7(G)). For example, if the surface film 53 is an SiO film or a thermal oxidation film formed by CVD, the portion of the surface film 53 that remains inside the through hole 64 can be removed by hydrofluoric acid or the like. At this time, a small quantity of etchant is placed on the upper surface 51' side of the substrate, and the surface film 53 in the vicinity of the opening of the through hole 64 is removed thereby.

After removing the portion of the surface film 53 remaining inside the through hole 64, the width of the through hole 64 is widened to a desired width W5 by performing a tertiary etching from the lower surface, and a semiconductor device having a functional portion 54 mounted thereon is obtained thereby (FIG. 7(H)). Anisotropic etching is preferred in the tertiary etching for the same reasons noted for the secondary etching. The etching conditions are adjusted so as to obtain the desired width W5.

In a semiconductor device obtained in this manner, the width W5 of the opening of the through hole 64 in the upper surface 51' of the substrate will be small, and will be formed in the desired position. More specifically, if a 6 inch silicon substrate is employed, a long and narrow or rectangular shaped through hole 64 having an opening width of approximately 20 micrometers or less can be formed in the upper surface of the silicon substrate. Because of that, a margin for deviations in the size and/or position of the opening 501 can be reduced, and thus a reduction in the size of and an increase in the precision of semiconductor chips that employ the present device can be facilitated. In addition, in both the wafer and the etching process, deviation in the size and/or position of the opening 501 in the upper surface 51' of the substrate can be prevented, yields increased, and the cost of semiconductor chips which employ the present device can be reduced.

As noted above, because the direction in which etching progresses is guided by the guide formed in the semiconductor substrate, a through hole having the desired size can be formed in the desired position on one surface of the semiconductor substrate from the other surface thereof. In addition, because the position and size of the opening of the through hole can be controlled, a highly precise semiconductor device can be produced with consistently good yields.

7. Seventh Embodiment

Figure 9:
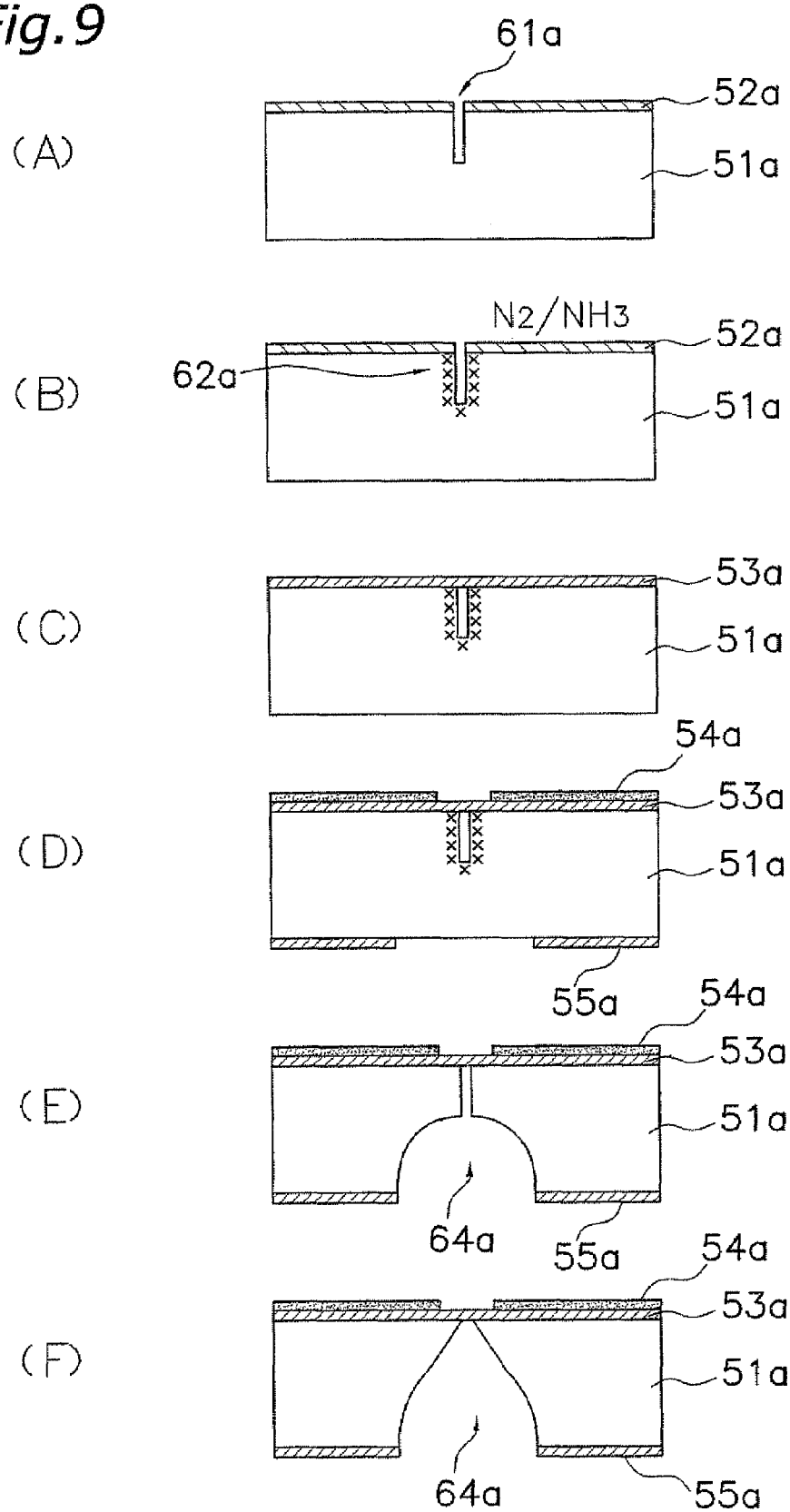
FIGS. 9(A) to 9(F) shows steps in the process of manufacturing a semiconductor device according to a seventh embodiment of the present invention.
Figure 10:
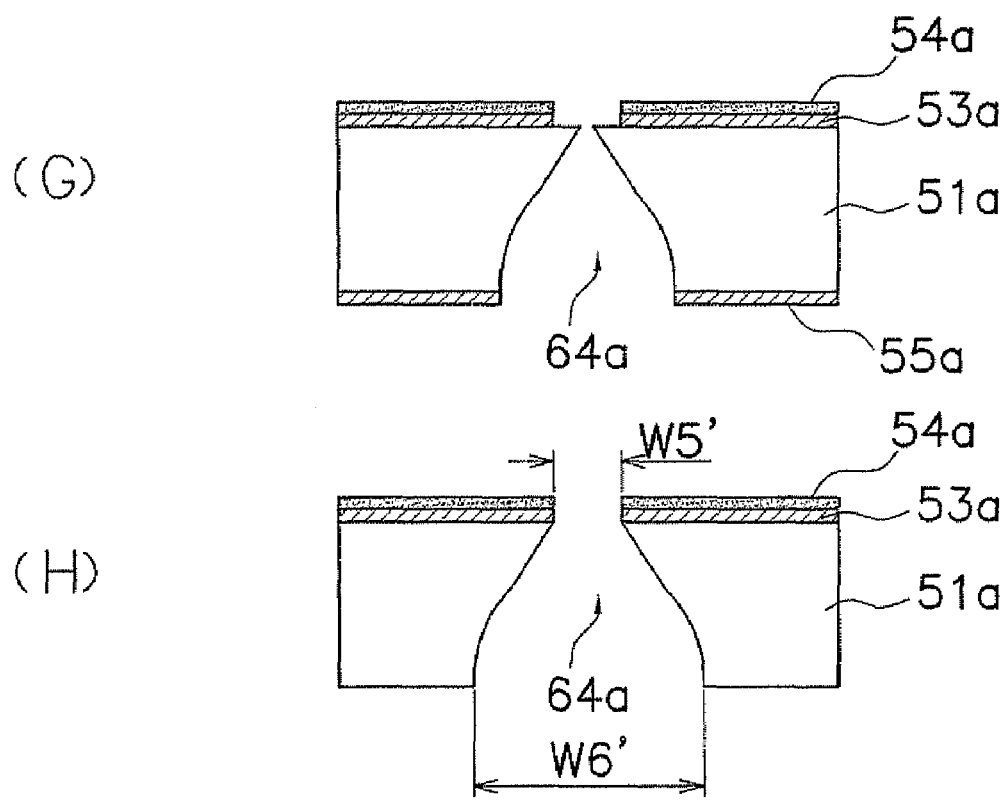
FIGS. 10(G) and (H) shows additional steps in the manufacturing process of the semiconductor device shown in FIG. 9.

FIGS. 9 and 10 show a semiconductor device according to a seventh embodiment and a method of producing the same. Like in FIGS. 7 and 8, a semiconductor device that employs a silicon substrate is used as an example.

First, like in FIGS. 7(A), (B), a guide 61a is formed in the silicon substrate 51a, the exposed silicon in the guide 61a is subject to a direct nitriding process, and lattice defects 62a are introduced into the area around the guide 61a thereby (FIGS. 9(A), (B)).

After this, the mask 52a is removed in accordance with need, a planar surface film 53a is formed on the silicon substrate 51a by means of CVD or the like, and the opening portion of guide 61a is filled thereby (FIG. 7(C)). A surface film 53a formed by plasma CVD or the like enters the interior of the guide 61a with difficulty because its ability to coat different levels is weaker than films that are formed by means of low pressure CVD, thermal oxidation, or the like. The surface film 53a can be made from the same materials noted above. If plasma CVD is employed, the film is formed, for example, in an $SiH_4+N_2O$ atmosphere. After that, in the same manner as described above, a functional portion 54a such as an integrated circuit or the like is formed on top of the surface film 53a, and a mask 55a made of SiN, $SiO_2$, or the like is formed on a lower surface 51a" of the substrate (FIG. 9(D)).

Furthermore, in the same manner as described above, anisotropic or isotropic primary etching is performed from the lower surface 51a" of the substrate, after that secondary etching is performed therefrom (preferably anisotropic), and a through hole 64a is formed up to the tip of the guide 61a (FIG. 9(E), (F)). The etching conditions are identical to those noted above.

After that, the portion of the surface film 53a that closes the through hole 64a is selectively etched from the lower surface 51a" of the substrate and removed (FIG. 10(G)). For example, if the surface film 53a is $SiO_2$, the portion of the surface film 53a that closes the through hole 64a or the surface film in the vicinity of the opening of the through hole 64a can be removed by means of hydrofluoric acid. If the surface film 53a is polysilicon, the surface film 53a can be selectively etched at a high rate by means of isotropic or anisotropic etching.

After the portion of the surface film 53a that closes the through hole 64a is removed, anisotropic tertiary etching is conducted as noted above from the lower surface, and the width of the through hole 64a is widened to a desired width W5' (FIG. 10(H)). The etching conditions are adjusted so as to obtain the desired width W5'.

The advantage of this process is that the process of removing the surface film 53a can be performed quickly because there is almost no surface film 53a remaining inside the through hole 64a.

8. Eighth Embodiment

Figure 11:
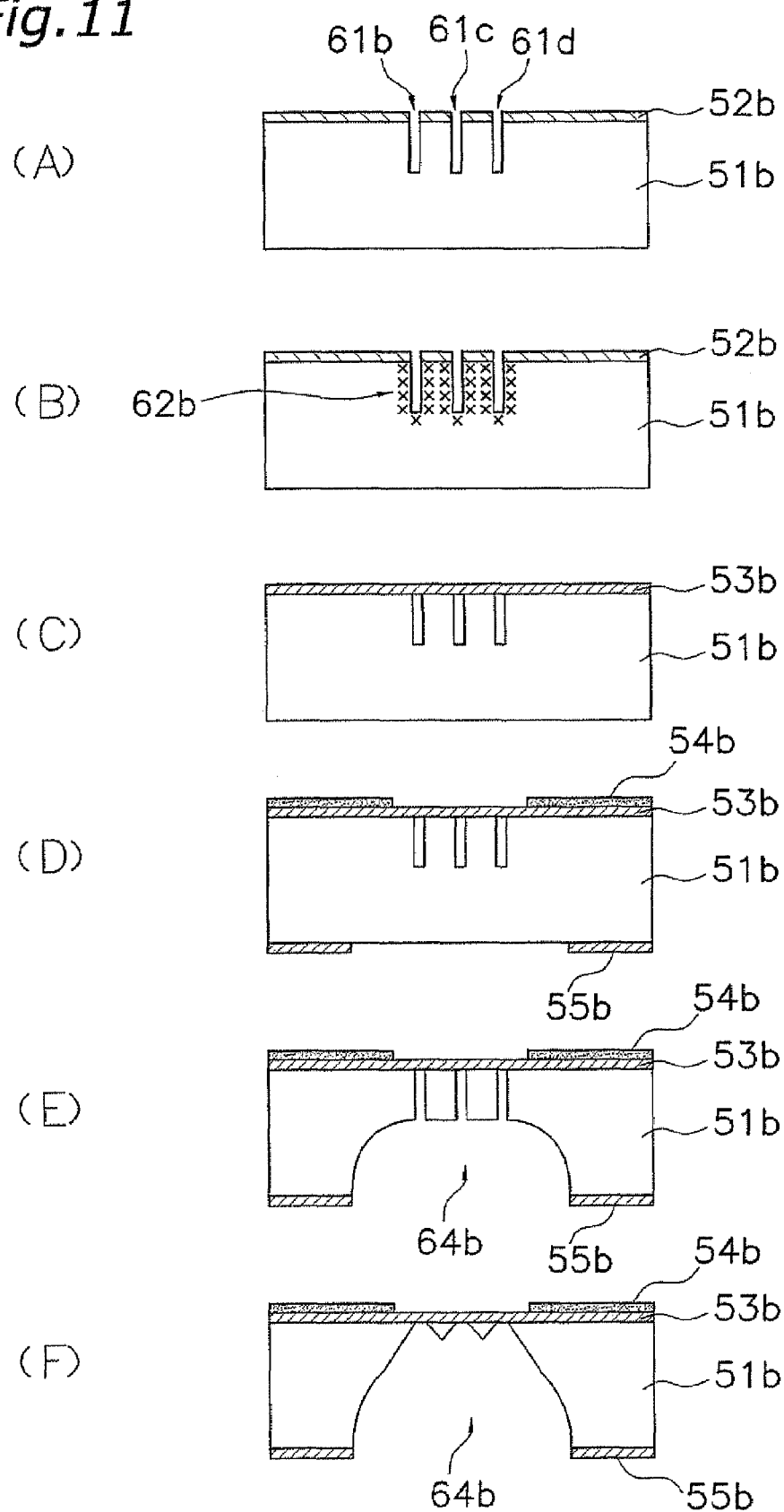

FIGS. 11 and 12 show a semiconductor device and a method of producing the same according to an eighth embodiment. When one wants to accurately form a through hole 64b having a comparatively large opening, a plurality of guides 61b, 61c, and 61d are formed, a plurality of openings are formed in the substrate surface by means of these guides, and the openings are then linked together in order to obtain one through hole.

First, a mask 52b made of SiN, SiO$_2$, or the like is formed on the upper surface of a silicon substrate 51b, high density plasma etching is performed from the upper surface of the substrate via a mask 52a, and groove-shaped guides 61b, 61c, and 61d each having a width of 1 micrometer are formed in a silicon substrate 51b (FIG. 11(A)). Lattice defects 62b are introduced into the surface of the silicon substrate that is exposed inside each guide (FIG. 11(B)). After this, the mask 52b is removed in accordance with need, a planar surface film 53b is formed on the silicon substrate 51b by means of CVD, thermal oxidation, or the like, and the guides 61b, 61c, and 61d are covered thereby (FIG. 11(C)). A functional portion 54b such as an integrated circuit or the like is formed on top of the surface film 53b, and a mask 55b made of SiN, SiO$_2$, or the like is formed on the lower surface 51b" of the substrate (FIG. 11(D)).

Furthermore, primary etching is performed from the lower surface 51b" of the substrate via the mask 55b, and a through hole 64b is formed up to the tips of the guides 61b, 61c, and 61d (FIG. 11(E)). The primary etching continues, secondary etching (preferably anisotropic etching) is performed, and the through hole 64b reaches the upper surface 51b' of the substrate (FIG. 11(F)). In this process, the end of the through hole 64b is branched along guides 61b, 61c, and 61d because the etching progresses along the guide 61b.

After that, the surface film 53b that covers a portion of the opening of the through hole 64b is selectively etched from the lower surface 51b" of the substrate and removed (FIG. 12(G)). Furthermore, tertiary etching (preferably anisotropic etching) is performed from the lower surface, the ends of the branched through hole 64b are linked together, and the width thereof is widened to a desired width W5" (FIG. 12(H)).

In this way, a large through hole, e.g., a through hole having an opening width of 100 micrometers or greater in the surface, can be formed from the lower surface at a desired position and with an accurate size.

9. Ninth Embodiment

FIG. 13 shows the basic structure of a semiconductor device according to a ninth embodiment. In the semiconductor device shown in this figure, a plurality of through holes 64e, 64f are formed. A plurality of openings 501e, 501f are formed in an upper surface 51e' of a substrate, and the plurality of openings 502e, 502f are formed in a lower surface 51e" of the substrate. By providing a plurality of guides in the semiconductor substrate 51e and forming independent through holes along each guide, a semiconductor device having a plurality of through holes can be produced.

EXAMPLE 2

Micropump

Figure 14:
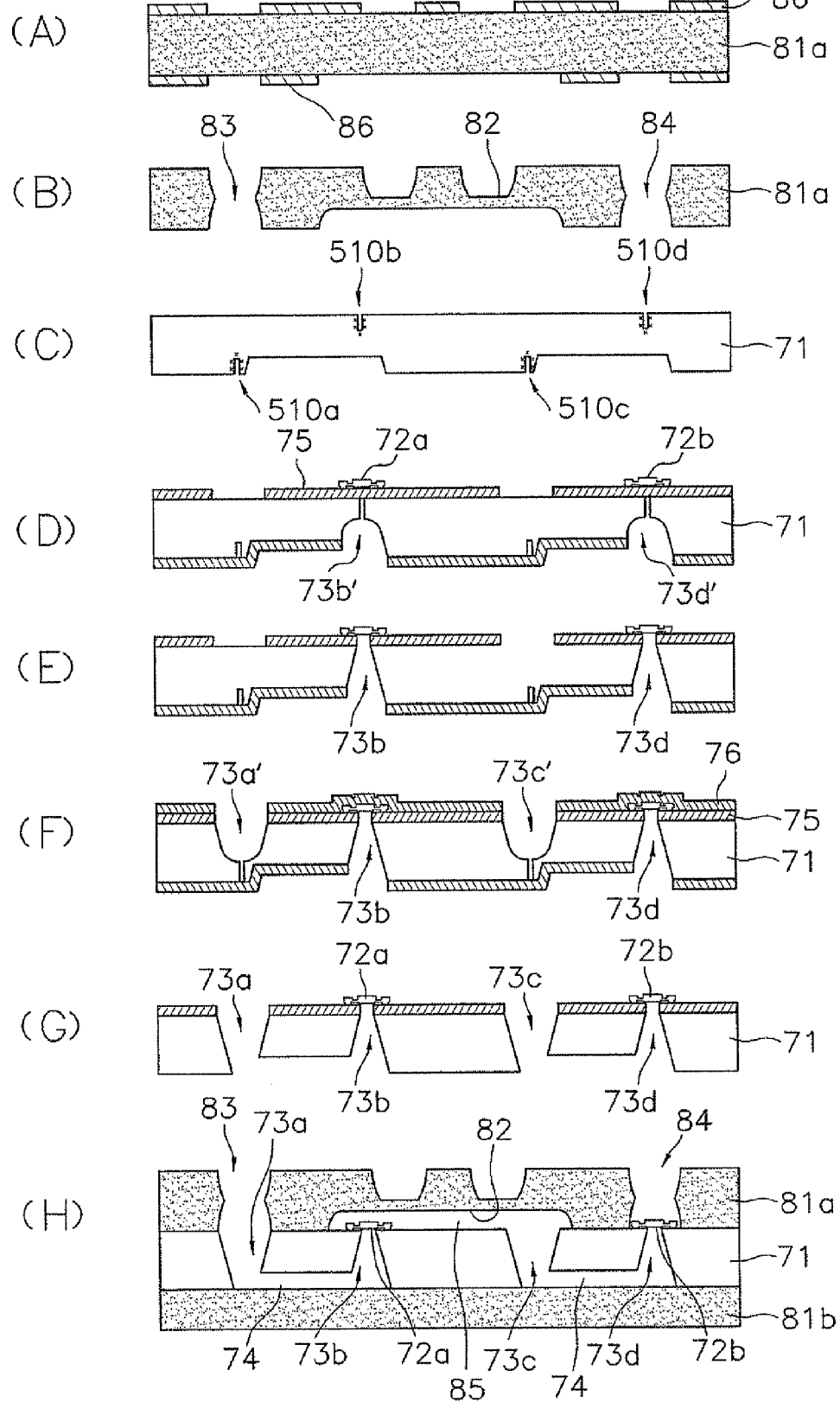
FIGS. 14(A) to 14(H) show steps in a process for manufacturing a micropump in which the basic structure of the semiconductor device according to the sixth embodiment of the present invention has been adopted.
Figure 15:
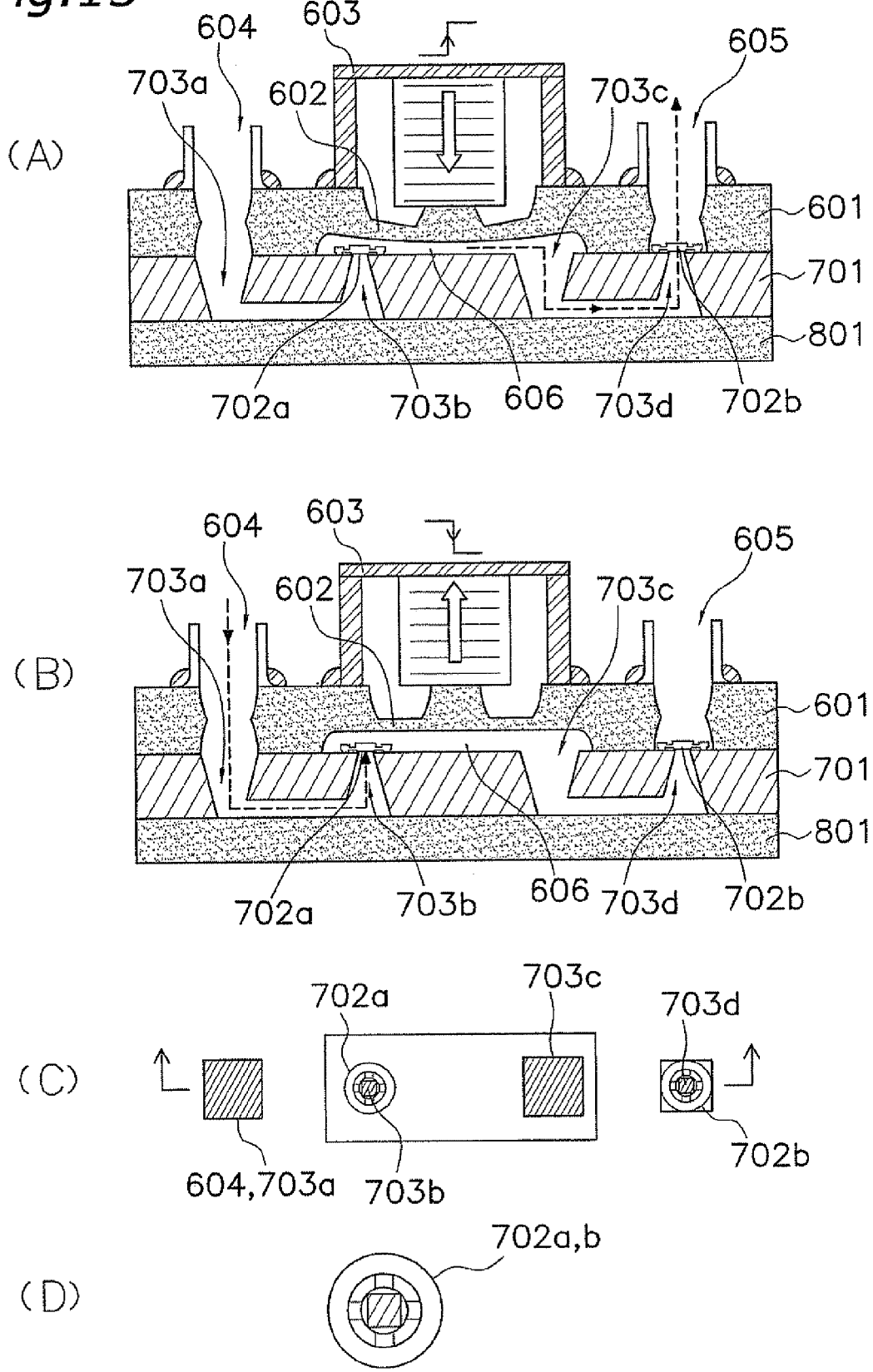
FIGS. 15(A) to 15(D) show the structure and operation of a conventional micropump.

FIG. 14 shows an example of a semiconductor device in which the basic structure disclosed in the sixth embodiment is applied in a micropump.

FIGS. 14(A)-(H) show the steps of producing the essential portions of a micropump, and FIG. 14(H) shows the structure of the essential portions of the micropump. As shown in FIG. 14(F), the micropump includes a silicon substrate 71 on which valves 72a, 72b are formed, and two heat-resistant glass plates 81a, 81b that are bonded to both surfaces of the silicon substrate 71.

A diaphragm 82, a liquid inlet 83, and a liquid outlet 84 are formed in the heat-resistant glass plate 81a. The diaphragm 82 forms a pressure chamber 85 between it and the surface of the silicon substrate 71. A piezoactuator (not shown in the figures) that serves to oscillate the diaphragm 82 is attached on top of the diaphragm 82, and changes the pressure inside the pressure chamber 85.

Through holes 73a, 73b, 73c, 73d (through holes 73) are formed in the silicon substrate 71. Valves 72a and 72b (valves 72) are respectively provided on the through holes 73b and 73d. In addition, the through holes 73a and 73d respectively open to the positions of the inlet 83 and the outlet 84 formed in the heat-resistant plate 81a, and liquid that is drawn in from the inlet 83 flows sequentially through the through holes 73a, 73b, 73c and 73d, and is then discharged from the outlet 84. The other two through holes 73b and 73c have openings that are inside the pressure chamber 85 in between the diaphragm 82 and the surface of the silicon substrate 71. A liquid channel 74 is formed between the lower surface of the silicon substrate 71 and the heat resistant glass plate 81, which allows the through hole 73a to communicate with the through hole 73b, and the through hole 73c to communicate with the through hole 73d.

Next, a method of producing the micropump shown in FIG. 14(H) will now be described with reference to FIGS. 14(A)-(H).

FIGS. 14(A) and (B) show the process of forming the diaphragm 82, the inlet 83, and the outlet 84 in the heat-resistant glass plate 81a. First, an etching mask, e.g., Cr—Cu, is vacuum deposited on both surfaces of the heat-resistant glass plate 81a, and a resist 86 is formed by photoetching both surfaces (see FIG. 14(A)). The etching mask and the resist 86 correspond to the diaphragm 82, the inlet 83, the outlet 84, and the pressure chamber 85. Next, 50% liquid hydrofluoric acid is used to form a lower surface of the pressure chamber 85. Furthermore, the diaphragm 82 is formed by covering the pressure chamber 85 portion with wax or the like and etching the upper surface. The diaphragm 82 is then covered with more wax, and etched is performed to form through holes that correspond to the inlet 83 and the outlet 84. After this, the resist and the etching mask are removed (see FIG. 14(B)).

FIGS. 14(C)-(G) show the process that forms the valves 72 and the through holes 73 in the silicon substrate 71. First, guides 510a, b, c, and d and lattice defects in the vicinity of the guides are formed in, for example, a <100> silicon substrate 71 by means of the method noted above (see FIG. 14(C)). In addition, an etching mask (e.g. SiO$_2$) that corresponds to the liquid channel 74 is formed on the lower surface of the silicon substrate 71, and the liquid channel 74 is formed therein by means of anisotropic etching (see FIG. 14(C)).

Next, a mask 75 having openings therein that correspond to the guides 510a-d is formed in the upper surface and lower surface of the silicon substrate 71. The mask 75 is formed, for example, from Si$_3$N$_4$ or SiO$_2$. The valves 72a, 72b are formed on the mask on the upper surface of the silicon substrate 71 by CVD and plasma etching a photoresist that is used as a mask. (See FIG. 14(D)). Furthermore, the through holes 73b, 73d that open below the valves 72a, 72b are formed by performing two-step etching from the lower surface of the silicon substrate 71 protected by the mask 75, and then adjusting the width of the openings by means of the etching (see FIGS. 14(D), (E)). These two through holes are formed such that the widths thereof narrow from the lower surface of the substrate to the upper surface thereof, and if for example a 6 inch silicon substrate is used, the widths of the openings in the upper surface of the substrate can be adjusted to be 20 micrometers or less.

The other two through holes 73a, 73c will then be formed, and the valves 72a, 72b formed on top of the upper surface of the silicon substrate 71 are protected with an etching mask 76 of, for example, $Si_3N_4$ or $SiO_2$ (see FIG. 14(F)). After this, through holes 73a, 73c in which the widths of the openings thereof narrow from the upper surface to the lower surface of the substrate are formed by etching the silicon substrate 71 from the upper surface thereof in two steps, and also by adjusting the width of the opening by etching. After this, the etching mask 76 that covers the valves 72a, 72b is removed, and a silicon substrate 71 having valves 72 and through holes 73 is obtained (see FIG. 14(G)).

The heat resistant glass plates 81a, 81b are bonded to the silicon substrate 71 by anode bonding to obtain the micropump shown in FIG. 14(H). The bonding occurs by, for example, heating to a temperature of approximately 400° C., and applying a negative voltage of approximately 500V to the heat-resistant glass plates.

In this type of micropump, the positions of the openings of the through holes 73 in the upper surface of the substrate are accurately controlled because the lattice defects introduced around the periphery of the guides 510 guide the etching in the steps that form the through holes 73. After that, through holes 73 having the desired widths can be formed in the desired positions by adjusting the etching conditions and widening the widths of small through holes until they reach the desired widths. Thus, a variety of elements and/or functional parts such as the valves 72, the pressure chamber 85, the liquid channel 74, the inlet 83, and the outlet 84 can be formed on the silicon substrate with a high degree of precision.

A micropump was used here as an example, but it is possible to apply the present invention to a variety of other micromachines such as microvalves or flow sensors.

The embodiments and examples noted above are illustrations of the present invention, and the present invention is not limited thereto. Other embodiments of the present invention that are clear to one of ordinary skill in the art are included in the scope of the present invention. The scope of the aforementioned present invention is as described in the patent claims.

What is claimed is:

1. A method of producing a semiconductor device, comprising:
    (a) forming a planar guide having a first opening therein in an interior of a semiconductor substrate along the planar direction of the substrate, the planar guide formed by implanting and annealing ions in the interior of the semiconductor substrate and so as to have an etching rate that is slower than the etching rate of the semiconductor substrate; and
    (b) forming a through hole having a width that decreases in size from a first surface of the semiconductor substrate to a second surface of the semiconductor substrate by etching the semiconductor substrate from the first surface,
    wherein step (a) includes
    forming a resist on a surface of the semiconductor substrate at a position that corresponds to the first opening to be formed in the planar guide,
    implanting and diffusing impurities at a high density into the semiconductor substrate, and
    forming a high density impurity diffusion layer having the first opening therein in the interior of the semiconductor substrate by forming a semiconductor epitaxial layer on the high density impurity diffusion layer.

2. A method of producing a semiconductor device, comprising:
    (a) forming a first guide on a first surface of the semiconductor substrate, the first guide being a groove shaped or hole shaped space;
    (b) etching the semiconductor from a second surface of the semiconductor substrate that is opposite the first surface thereof toward the first guide to form a through hole that passes through the semiconductor substrate; and
    introducing lattice defects into the semiconductor substrate around the periphery of the first guide.

3. The method of producing a semiconductor device set forth in claim 2, further comprising:
    forming a surface film on the first surface that covers at least the first guide with a material whose etching rate is slower than the etching rate of the semiconductor substrate.

4. The method of producing a semiconductor device set forth in claim 3, wherein:
    the semiconductor substrate is a silicon substrate; and
    the surface film is a silicon oxide film or polysilicon.

5. The method of producing a semiconductor device set forth in claim 3, wherein
    the surface film is formed by chemical vapor deposition.

6. The method of producing the semiconductor device disclosed in claim 2, further comprising:
    adjusting the width of the through hole.

7. The method of producing a semiconductor device set forth in claim 2, wherein step (b) further comprises:
    forming a through hole up to the tip of the first guide by means of anisotropic etching or isotropic etching;
    and performing anisotropic etching until the through hole passes through to the first surface.

8. The method of producing a semiconductor device set forth in claim 2, wherein:
    a second guide is further formed in step (a), the second guide being a groove shaped or hole shaped space; and
    a through hole is formed in step (b) that passes through the semiconductor substrate by etching the semiconductor substrate from a second surface of the semiconductor substrate that is opposite the first surface thereof toward the first guide and the second guide.

* * * * *